US012791635B2

(12) United States Patent
Kishida et al.

(10) Patent No.: US 12,791,635 B2
(45) Date of Patent: Nov. 10, 2026

(54) DETECTION SUBSTRATE, DETECTOR, AND DETECTING DEVICE

(71) Applicant: KYOCERA CORPORATION, Kyoto (JP)

(72) Inventors: Yuji Kishida, Tsukuba (JP); Hiromichi Yoshikawa, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 135 days.

(21) Appl. No.: 18/562,786

(22) PCT Filed: May 20, 2022

(86) PCT No.: PCT/JP2022/021004

§ 371 (c)(1),
(2) Date: Nov. 20, 2023

(87) PCT Pub. No.: WO2022/249995

PCT Pub. Date: Dec. 1, 2022

(65) Prior Publication Data

US 2024/0219486 A1 Jul. 4, 2024

(30) Foreign Application Priority Data

May 25, 2021 (JP) ................................ 2021-087914
Sep. 27, 2021 (JP) ................................ 2021-156983

(51) Int. Cl.
*G01R 33/035* (2006.01)

(52) U.S. Cl.
CPC ................................ *G01R 33/0354* (2013.01)

(58) Field of Classification Search
CPC .... G02B 6/32; G02B 6/4202; G01R 33/0354; G01R 33/26; G01R 33/0005; G01R 33/0017; G01R 33/032
See application file for complete search history.

(56) References Cited

U.S. PATENT DOCUMENTS 10,509,001 B2 12/2019 Lutz et al.
2007/0068909 A1 * 3/2007 Karasawa ................ H05B 6/68 219/121.43

(Continued)

FOREIGN PATENT DOCUMENTS

CN 108983121 A 12/2018
CN 110462417 A 11/2019

(Continued)

OTHER PUBLICATIONS

Simpson, David A., et al. "Magneto-optical imaging of thin magnetic films using spins in diamond." Scientific Reports 6.1 (2016): 22797, 12 pages.

(Continued)

*Primary Examiner* — Lee E Rodak
*Assistant Examiner* — Taqi R Nasir
(74) *Attorney, Agent, or Firm* — Duane Morris LLP

(57) ABSTRACT

A detection substrate includes a diamond crystal in which an NV center is arranged, and an antenna conductor provided on the diamond crystal. The diamond crystal can be provided with both the NV center and the antenna conductor. A microwave having a sufficient intensity can therefore effectively be applied to the NV center at a specific region with a small amount of power.

17 Claims, 9 Drawing Sheets

(56) References Cited

U.S. PATENT DOCUMENTS

| | | | | |
|---|---|---|---|---|
| 2008/0158092 | A1 | 7/2008 | Yakubo et al. | |
| 2011/0062957 | A1* | 3/2011 | Fu | G01N 24/088 324/307 |
| 2013/0169267 | A1 | 7/2013 | Miyakoshi et al. | |
| 2015/0048822 | A1* | 2/2015 | Walsworth | G01R 33/60 324/309 |
| 2016/0282427 | A1 | 9/2016 | Heidmann | |
| 2016/0313408 | A1 | 10/2016 | Hatano et al. | |
| 2017/0234941 | A1 | 8/2017 | Hatano et al. | |
| 2017/0343695 | A1* | 11/2017 | Stetson | G01V 3/101 |
| 2018/0364165 | A1 | 12/2018 | Barry et al. | |
| 2020/0132785 | A1 | 4/2020 | Yoshii | |
| 2020/0334559 | A1* | 10/2020 | Anderson | G06N 20/00 |
| 2021/0103010 | A1 | 4/2021 | Rosenfeld | |
| 2021/0140996 | A1 | 5/2021 | Degen et al. | |
| 2021/0378569 | A1 | 12/2021 | Ma et al. | |

FOREIGN PATENT DOCUMENTS

| | | | | |
|---|---|---|---|---|
| CN | 111568418 | A | 8/2020 | |
| DE | 102020109477 | A1 | 1/2021 | |
| JP | 2007096645 | A | 4/2007 | |
| JP | 2008181492 | A | 8/2008 | |
| JP | 2013238580 | A | 11/2013 | |
| JP | 2016014541 | A | 1/2016 | |
| JP | 2016205954 | A | 12/2016 | |
| JP | 2017146158 | A | 8/2017 | |
| JP | 2020038086 | A * | 3/2020 | G01N 21/64 |
| JP | 2020067444 | A | 4/2020 | |
| JP | 2021165670 | A | 10/2021 | |

OTHER PUBLICATIONS

Broadway, D. A., et al. "Microscopic imaging of elastic deformation in diamond via in-situ stress tensor sensors." arXiv preprint arXiv:1812.01152, Cornell University Library, 201 Olin Library Cornell University Ithaca, NY 14853, (2018), 20 pages.

Toraille, Loïc, et al. "Optical magnetometry of single biocompatible micromagnets for quantitative magnetogenetic and magnetomechanical assays." Nano Letters 18.12 (2018): 7635-7641.

Le Sage, David, et al. "Optical magnetic imaging of living cells." Nature 496.7446 (2013): 486-489.

Cai, Mingcheng, et al. "Parallel optically detected magnetic resonance spectrometer for dozens of single nitrogen-vacancy centers using laser-spot lattice." Review of Scientific Instruments 92.4 (2021), 8 pages.

McCoey, Julia M., et al. "Quantum magnetic imaging of iron biomineralization in teeth of the chiton Acanthopleura hirtosa." Small Methods 4.3 (2020): 1900754, 7 pages.

Golter, D.A et al.,"Coupling a Surface Acoustic Wave to an Electron Spin in Diamond via a Dark State", Physical Review X 6, 041060, Dec. 20, 2016, 11 pages.

* cited by examiner

DETECTION SUBSTRATE, DETECTOR, AND DETECTING DEVICE

TECHNICAL FIELD

The present disclosure relates to a detection substrate, a detector, and a detecting device.

BACKGROUND OF INVENTION

Patent Document 1 discloses a device that measures a magnetic field on each point of a sample using a SQUID element.

CITATION LIST

Patent Literature

Patent Document 1: JP 2016-014541 A

SUMMARY

Summary of the Invention

In the technique described in Patent Document 1, a sapphire window needs to be inserted between the sample and the SQUID element, and a certain distance needs to be provided for heat insulation between the sapphire window and the SQUID element. As such, the SQUID element cannot be brought close to the sample. Separating magnetic field distributions close to each other and observing each magnetic field distribution is therefore difficult. Thus, there is room for improvement in the detection accuracy.

Solution to Problem

A detection substrate according to one aspect includes a diamond crystal in which an NV center is formed at one face, and a radiator positioned at a face of the diamond crystal opposite to the one face at which the NV center is formed.

A detector according to one aspect is a detector including a detection substrate and a dielectric base, in which the detection substrate includes a diamond crystal in which an NV center is formed, and a radiator provided at the diamond crystal.

A detecting device according to one aspect is a detecting device including the detector, a light emitting element, and a light receiving element, in which the light emitting element irradiates the NV center with light, and the light receiving element receives fluorescence of the NV center.

Advantageous Effect

According to the detection substrate, the detector, and the detecting device according to one aspect of the present disclosure, a magnetic field can be detected with high accuracy.

DESCRIPTION OF EMBODIMENTS

Figure 1:
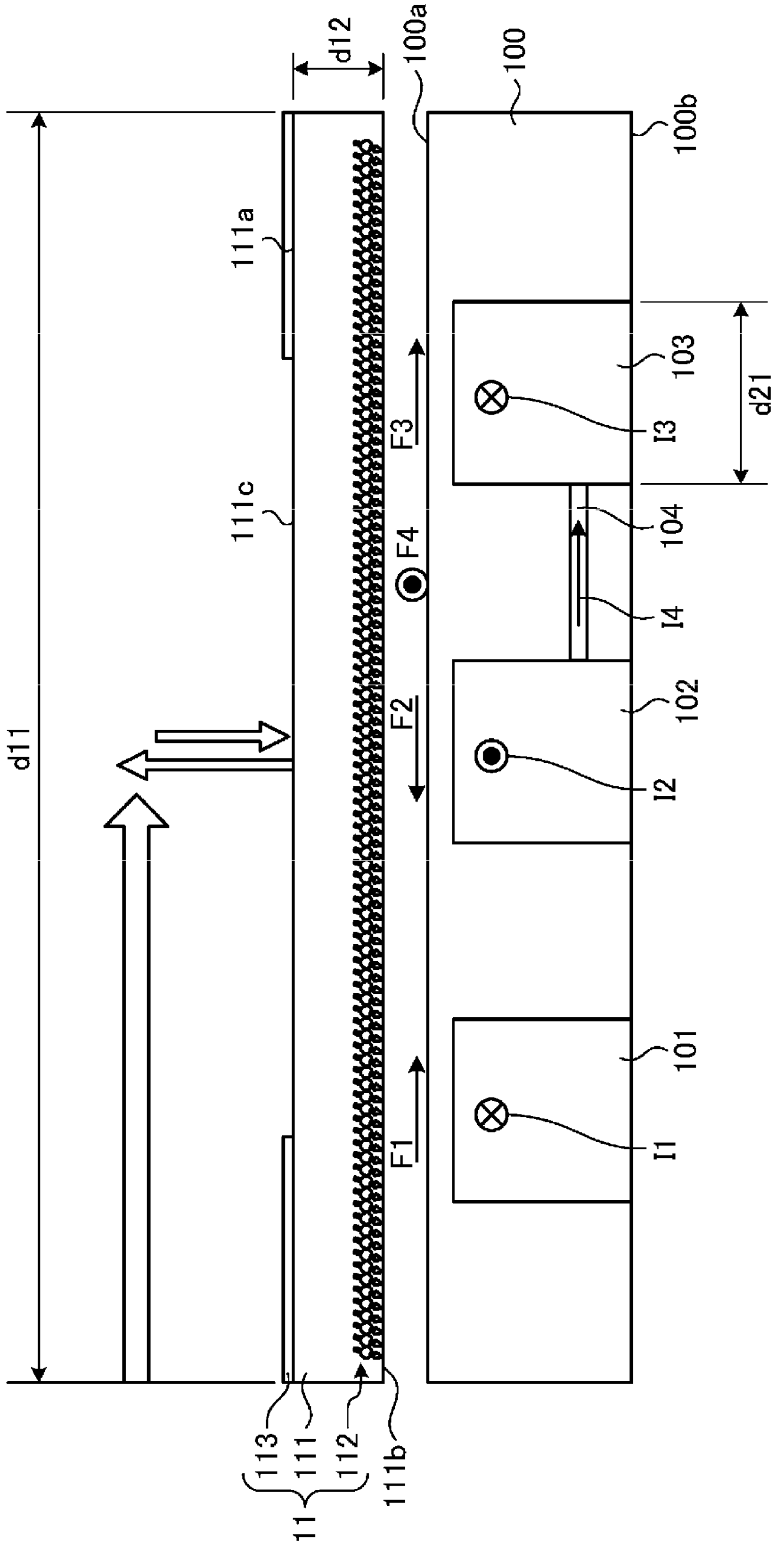
FIG. 1 is a cross-sectional view schematically illustrating a detection substrate of a detector according to a first embodiment.
Figure 2:
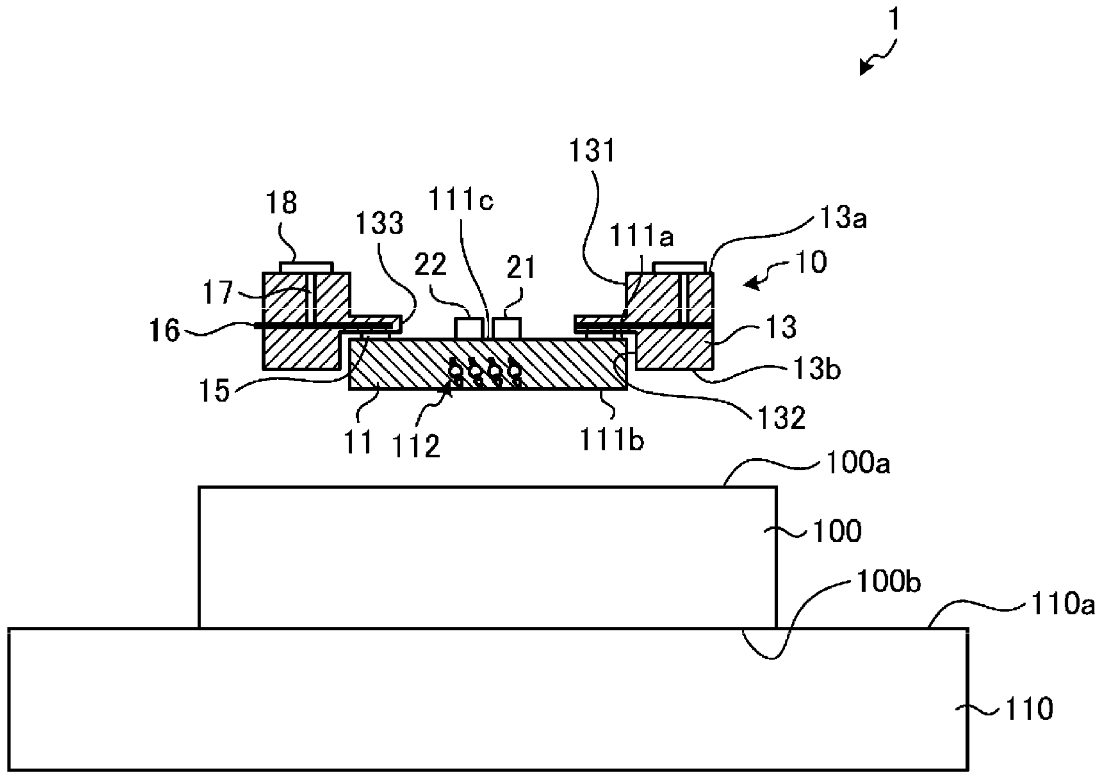
FIG. 2 is a schematic diagram illustrating an example of the detector and a detecting device according to the first embodiment.
Figure 3:
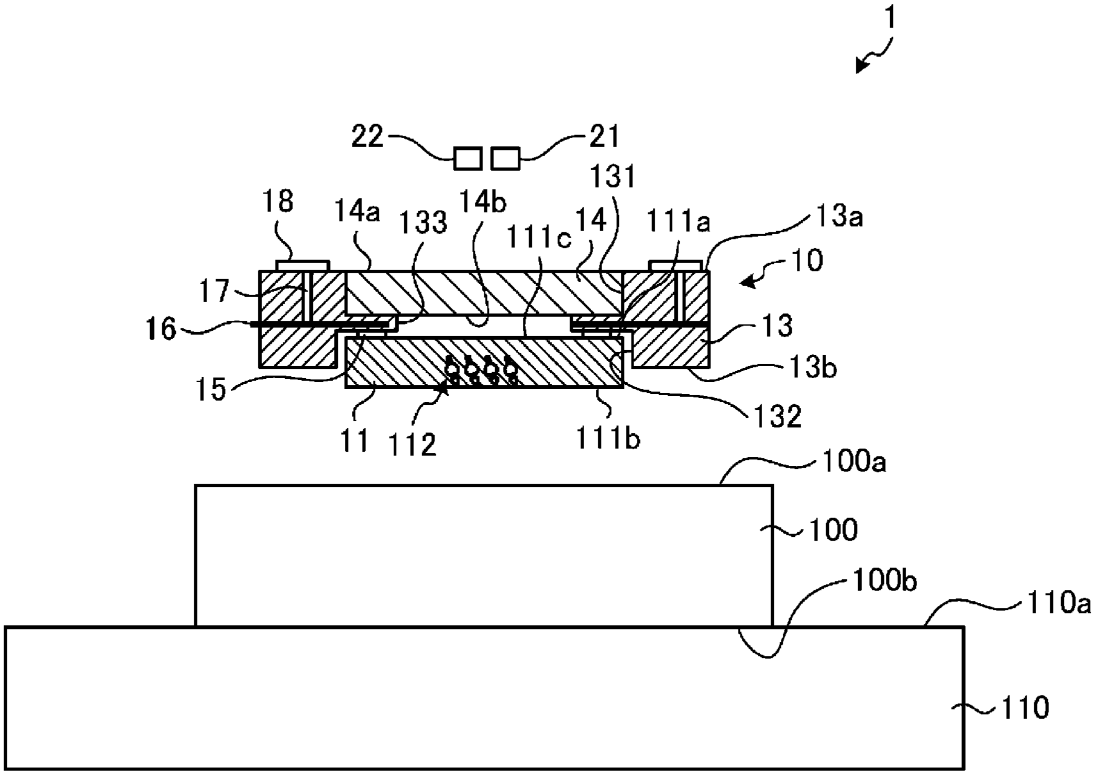
FIG. 3 is a schematic diagram illustrating another example of the detector and the detecting device according to the first embodiment.

Hereinafter, a detector and a detecting device according to an embodiment will be described. The detector and the detecting device are for detecting a magnetic field generated in a detection target. FIG. 1 is a cross-sectional view schematically illustrating a detection substrate of the detector according to a first embodiment. FIG. 2 is a schematic diagram illustrating an example of the detector and the detecting device according to the first embodiment. FIG. 3 is a schematic diagram illustrating another example of the detector and the detecting device according to the first embodiment.

First Embodiment

Detection Target

The detection target is a target object of detection by a detector 10 and a detecting device 1, in other words, a sample. In the detection target, a magnetic field is generated by a current. In the example illustrated in FIG. 1, the detection target includes a dielectric body 100, and a conductor 101, a conductor 102, a conductor 103, and a conductor 104 arranged inside the dielectric body 100. The conductor 101, the conductor 102, and the conductor 103 are arranged at intervals at a face 100*a* side of the dielectric body 100. A width d21 of the conductor 101, the conductor 102, and the conductor 103 is, for example, about 1 μm. The conductor 104 is arranged at a face 100*b* side of the dielectric body 100. In the conductor 101, a current I1 flows from the front side to the back side in FIG. 1. The current I1 flows at the face 100*a* side of the dielectric body 100. The orientation of a magnetic field F1 by the current I1 is indicated by an arrow. In the conductor 102, a current I2 flows from the back side to the front side in FIG. 1. The current I2 flows at the face 100*a* side of the dielectric body 100. The orientation of a magnetic field F2 by the current I2 is indicated by an arrow. In the conductor 103, a current I3 flows from the front side to the back side in FIG. 1. The current I3 flows at the face 100*a* side of the dielectric body 100. The orientation of a magnetic field F3 by the current I3 is indicated by an arrow. In the conductor 104, a current I4 flows from the left side to the right side in FIG. 1. The current I4 flows at the face 100*b* side of the dielectric body 100. The orientation of a magnetic field F4 by the current I4 is indicated by an arrow.

Detector

The detector 10 includes a detection substrate 11 and a dielectric base 13.

The detection substrate 11 is a so-called diamond sensor. The detection substrate 11 includes a diamond crystal 111, an NV center 112, a high-frequency line conductor not illustrated, and an antenna conductor 113 that is a radiator.

In the diamond crystal 111, the NV center 112 is arranged in or at a face 111*b* side opposite to a face 111*a* in contact with the antenna conductor 113. In the diamond crystal 111, a length d11 of one side is, for example, 2 mm. The diamond crystal 111 has a thickness d12 of, for example, 100 μm.

The face 111*a* is exposed at a region devoid of the antenna conductor 113. The exposed portion is referred to as an exposed portion 111*c*. The exposed portion 111*c* is positioned at a center portion of the face 111*a* of the diamond crystal 111.

The face 111*b* is a magnetic field action surface facing the detection target. The NV center 112 is arranged in or at the face 111*b* side. The face 111*b* is a smooth flat surface that can be in close contact with or close to a face of the detection target at a level equal to or less than several μm in a state of being kept parallel to the face of the detection target. The face 111*b* may be provided with a conductor thin film for causing a current to flow through magnetic field coupling with the detection target.

An objective lens not illustrated may be arranged close to the face 111*a* of the diamond crystal 111, and an antireflection film may be provided on the surfaces of the diamond crystal 111 and the objective lens.

On the diamond crystal 111, the face 111*b* provided with the NV center 112 protrudes with respect to the dielectric base 13. The face 111*b* is a region where the magnetic field of a measurement target is sensed.

A single one of the NV center 112 may be arranged or a plurality of the NV centers may be arrayed in or at the face 111*b* side of the diamond crystal 111. In the present embodiment, FIG. 1 and the like illustrate a state in which the plurality of NV centers 112 are arrayed. The orientations of the NV centers 112 are preferably aligned in one direction. The NV center 112 may be crystals of a plurality of different orientations.

The NV center 112 is a complex defect in which a portion of the diamond crystal 111 where carbon originally exists is replaced with nitrogen, and a vacancy is present at an adjacent position. In the NV center 112, a part of a degenerating shared electron pair is lost. The NV center 112 includes electrons with orbital angular momenta of two levels: m=0 and m=±1 in a zero magnetic field. Since the electrons with m=±1 have a magnetic moment, the electrons are affected by an external magnetic field, the degeneracy of m=±1 is also solved, and the electrons further have two energy levels. The strength of the external magnetic field can be detected by detecting electron spin resonance caused by these energy levels using light waves and microwaves.

The electrons in the NV center 112 are excited by light having a wavelength of 532 nm and emit fluorescence having a wavelength of 638 nm during the process of relaxation. This fluorescence process does not likely occur at electron spin resonance frequencies. Therefore, use of this property enables an electron state of m=±1 to be observed. At the NV center 112 of the diamond crystal 111, the electron spin resonance frequency in the zero magnetic field is known to be about 2.87 GHz. When a microwave having this resonance point frequency (resonance frequency) is radiated, the fluorescence having a wavelength of 638 nm is quenched. The resonance frequency of the microwave changes due to a change in the electron state of m=±1 according to the magnitude of the external magnetic field and the like. By capturing this change due the frequency change of the fluorescence intensity, the magnetic field and the current can be detected. Light having a wavelength of 532 nm comes in through the exposed portion 111*c*, and the fluorescence having a wavelength of 638 nm is emitted from the exposed portion 111*c*.

The high-frequency line conductor is formed on the face 111*a* of the diamond crystal 111. The high-frequency line conductor has a central conductor and a ground conductor separated from the central conductor by a certain distance. Impedance is adjusted through the distance between the central conductor and the ground conductor. The central conductor and the ground conductor are respectively connected to the central conductor and the ground conductor of the high-frequency line conductor of the dielectric base 13 by solder 15.

The antenna conductor 113 transmits and radiates microwaves with which the NV center 112 of the diamond crystal 111 is irradiated. The antenna conductor 113 is positioned on a face of the diamond crystal 111 opposite to a face on which the NV center 112 is formed. The antenna conductor 113 is electrically connected to an exposed portion of an interior pattern 16 of the dielectric base 13 with the solder 15 interposed therebetween. The antenna conductor 113 is provided at an outer peripheral side on the face 111*a* of the diamond crystal 111. The antenna conductor 113 has a ring shape as viewed in the normal direction (hereinafter, referred to as "plan view") of the face 111*a*. The antenna conductor 113 is a loop antenna made of a conductor thin film. An end portion of the antenna conductor 113 is connected to the ground conductor of the high-frequency line conductor. The antenna conductor 113 has a loop diameter of about several mm. The exposed portion 111*c* is arranged substantially at the center of the inner side of the antenna conductor 113, and serves as an optical incident/emission portion. The exposed portion 111*c* is arranged inside a flange 133 of the dielectric base 13.

The dielectric base 13 is a support base supporting the outer peripheral side of the detection substrate 11. The dielectric base 13 accommodates the detection substrate 11. The dielectric base 13 has a tubular shape that accommodates the detection substrate 11. In the present disclosure, the dielectric base 13 has a square tubular shape corresponding to the outer shape of the detection substrate 11. The dielectric base 13 is made of, for example, $SiO_2$, a glass material, a ceramic material, or a resin-based material such as glass epoxy. In the dielectric base 13, a high-frequency transmission line is formed, and this high-frequency transmission line is electrically connected to the antenna conductor 113.

The dielectric base 13 includes a first accommodation 131, a second accommodation 132, and the flange 133. The first accommodation 131 and the second accommodation 132 are separated from each other by the flange 133 arranged at an intermediate portion in an axial direction of the dielectric base 13. The flange 133 protrudes to the inner peripheral side of the dielectric base 13. The flange 133 has a ring shape in a plan view. The first accommodation 131 is a supporter supporting an optical window 14. The first accommodation 131 is arranged at one side in the axial direction of the dielectric base 13. The optical window 14 is arranged at a center portion of the first accommodation 131 of the dielectric base 13. The second accommodation 132 is a supporter supporting the detection substrate 11. The second accommodation 132 is arranged at the other side in the axial direction of the dielectric base 13. The detection substrate 11 is arranged at a center portion of the second accommodation 132 of the dielectric base 13.

FIG. 2 illustrates a configuration in which the face 111*b* protrudes more than a face 13*b* of the dielectric base 13 in the axial direction, but the face 111*b* and the face 13*b* of the dielectric base 13 may be flush.

The optical window 14 is accommodated by the dielectric base 13 and is arranged to face the detection substrate 11. The optical window 14 is supported by the first accommodation 131 of the dielectric base 13. The optical window 14 inputs and outputs light to and from the NV center 112 of the detection substrate 11 of the detector 10. The optical window 14 is made of a material such as sapphire or quartz. One face 14*a* of the optical window 14 is flush with a face 13*a* opposite to the face 13*b* of the dielectric base 13. A face 14*b* opposite to the face 14*a* of the optical window 14 faces the face 111*a* of the diamond crystal 111 of the detection substrate 11 with a gap therebetween. The optical window 14 is not an essential component.

The dielectric base 13 includes a high-frequency transmission line including the interior pattern 16 and a Radio Frequency (RF) via 17, and transmits a microwave signal to the detection substrate 11. The high-frequency transmission line includes two conductors provided on the dielectric base 13. One of the conductors is a central conductor, and the other is a ground conductor. The central conductor and the ground conductor are separated by a certain distance. The interior pattern 16 and the RF via 17 constitute either the central conductor or the ground conductor. The central conductor and the ground conductor are respectively connected to the central conductor and the ground conductor of the high-frequency line conductor of the detection substrate 11 by the solder 15. The interior pattern 16 is a thin-film conductor pattern formed inside the dielectric base 13, and includes a partially exposed region on a surface of the dielectric base 13.

An example of a configuration in which the interior pattern 16 and the RF via 17 function as a high-frequency transmission line will be described. In the RF via 17, a through hole is formed in a via inner wall. This through hole functions as a signal line. In the interior pattern 16, a ground line (ground conductor) may run at both sides of a signal line (central conductor) in a plan view. The through hole of the RF via 17 is connected to the signal line of the interior pattern 16. The signal line of the interior pattern 16 is connected via the solder 15 to a pad 1142 (see, for example, FIG. 9) to which the end portion of the antenna conductor 113 is connected. In this manner, the high-frequency microwave signal is transmitted through a high-frequency transmission line via a microwave source, a pad 18, the via 17, the interior pattern 16, the solder 15, the pad 1142, and the antenna conductor 113 in order. As a result, microwaves are generated from the antenna conductor 113.

The solder 15 is provided on a lower face of the flange 133 of the dielectric base 13. The solder 15 is provided in a ring shape in a plan view. The solder 15 is electrically connected to the antenna conductor 113 and the interior pattern 16 of the detection substrate 11.

The interior pattern 16 is provided on the flange 133 of the dielectric base 13. The interior pattern 16 is electrically connected to the solder 15 and the RF via 17.

The RF via 17 extends from the interior pattern 16 to the face 13*a* of the dielectric base 13 at an outer periphery of the dielectric base 13. The RF via 17 is electrically connected to the interior pattern 16 and a bonding pad 18.

The bonding pad 18 is provided on the face 13*a* of the dielectric base 13. The bonding pad 18 is electrically connected to the RF via 17.

Note that with the dielectric base 13 described above, an example including the first accommodation 131, the second accommodation 132, and the flange 133 has been presented, but a configuration not including the first accommodation 131, the second accommodation 132, and the flange 133 may also be adopted.

Figure 4:
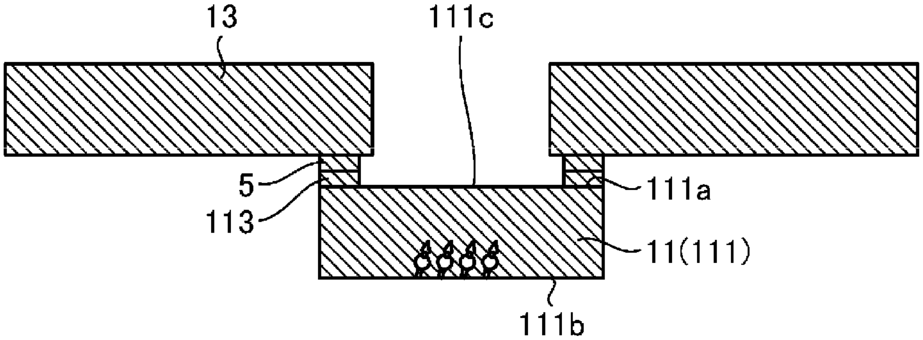
FIG. 4 is a schematic diagram illustrating another example of a dielectric base.

FIG. 4 is a schematic diagram illustrating another example of the dielectric base. For example, as illustrated in FIG. 4, the dielectric base 13 may have a flat plate shape and may include a through hole at the center. The dielectric base 13 includes a high-frequency transmission line on a surface or the inside thereof. The diamond crystal 111 of the detection substrate 11 is provided on a lower face of the dielectric base 13 that closes the through hole. The antenna conductor 113 provided on an upper face (the face 111*a*) of the detection substrate 11 is connected to the high-frequency transmission line of the dielectric base 13 via the solder 5. The exposed portion 111*c* of the diamond crystal 111 is visible from the upper face side of the dielectric base through the through hole. A high-frequency connector may be attached to an end portion of the high-frequency transmission line.

According to this configuration, since a microwave input end portion having a large size can be provided that is easy to handle because the dielectric base is used as an intermediary even if the diamond crystal 111 is small, the characteristic impedance to the NV center 112 is controlled to easily pass microwaves. In the detector 10 configured as described above, light and microwaves are input and output from the face 111*a* side, and therefore a microcircuit or the like of a detection target can be brought close to the face 111*b* side to perform detection with favorable sensitivity. Since the NV center 112 is irradiated with microwaves from the face 111*a* side, transmission of microwaves is not hindered by the microcircuit or the like of the detection target as compared with when the NV center 112 is irradiated with microwaves from the face 111*b* side. it is therefore suitable for detection of various microcircuits and the like such as a detection target having a large thickness and a plurality of circuits included in the thickness direction. Even if the antenna conductor 113 has a compact size, microwaves can be efficiently applied using a high-frequency line conductor or a high-frequency connector, and thus, the antenna conductor 113 is preferable for high-resolution detection of a microcircuit or the like.

Detecting Device

The detecting device 1 includes the detector 10, a light emitting element 21, and a light receiving element 22. More specifically, the detecting device 1 includes the detection substrate 11, the dielectric base 13 that accommodates the detection substrate 11, and the light emitting element 21 and the light receiving element 22 that input and output light to and from the NV center 112. The detecting device 1 may include a sample stage 110 on which a detection target is placed.

The light emitting element 21 and the light receiving element 22 detect magnetism of the dielectric body 100 that is a detection target. In the present embodiment, the light emitting element 21 and the light receiving element 22 detect magnetism while scanning the dielectric body 100. The light emitting element 21 and the light receiving element 22 are arranged to face the detection substrate 11 of the detector 10. The light emitting element 21 and the light receiving element 22 input and output light to and from the NV center 112 of the diamond crystal 111. The light emitting element 21 is a light source, and the light receiving element 22 is a light receiver. The light emitting element 21 and the light receiving element 22 are controlled by a control circuit not illustrated. The control circuit controls light emission in the light emitting element 21. The control circuit controls light reception in the light receiving element 22. The control circuit processes a red fluorescence signal received by the light receiving element 22. The control circuit outputs the intensity of the magnetic field as a result.

The light emitting element 21 irradiates the detection substrate 11 of the detector 10 with light. The light emitting element 21 emits excitation light for irradiating the diamond crystal 111. The light emitting element 21 irradiates the NV center 112 with excitation light. The light emitting element 21 is a laser diode. The light emitting element 21 emits, for example, laser light having a wavelength of 527 nm in accordance with control by the control circuit. The light emitting element 21 emits green excitation light. As the light emitting element 21, for example, a green Light Emitting Diode (LED), a green face emitting laser diode (VCSEL: Vertical Cavity Surface Emitting Laser), a green end face emitting Laser Diode (LD), or the like can be used.

The light receiving element 22 detects fluorescence of the detection substrate 11 of the detector 10. The light receiving element 22 is a photodiode. The light receiving element 22 receives the fluorescence from the NV center 112 of the diamond crystal 111 in accordance with the control of the control circuit. The light receiving element 22 receives the fluorescence emitted by the excitation light from the diamond crystal 111. As the light receiving element 22, for example, a Si—PIN Photo Diode (PD), an InGaAs—PIN photodiode, or the like can be used.

The light emitting element 21 and the light receiving element 22 may, for example, be arranged in close contact with the exposed portion 111*c* of the face 111*a* of the diamond crystal 111 as illustrated in FIG. 2. In this case, power is fed to each of the light emitting element 21 and the light receiving element 22 from wiring not illustrated formed independently from the dielectric substrate 13.

For example, as illustrated in FIG. 3, the light emitting element 21 and the light receiving element 22 may be arranged immediately above the exposed portion 111*c* of the face 111*a* of the diamond crystal 111 while being separated from each other by a certain distance. In this case, for example, an optical window, which is an optical component such as a lens or a mirror, may be used between the light emitting element 21 and the light receiving element 22, and the NV center 112. The light emitting element 21 and the light receiving element 22 may be an optical pickup in which light reception and emission are integrated.

The sample stage 110 is a table on which a target object is placed. The sample stage 110 includes a face 110*a* that is flat. The target object is placed on the face 110*a*.

With the light emitting element 21 and the light receiving element 22 downsized, fluorescence and excitation light may be input and output while scanning the face 111*a* of the diamond crystal 111 of the detection substrate 11 of the detector 10.

The light emitting element 21 and the light receiving element 22 may each have a shape that enables inputting and outputting fluorescence and excitation light to and from the entire face of the face 111*a* of the diamond crystal 111 of the detection substrate 11 of the detector 10 without needing to perform scanning.

The microwave with which the NV center 112 of the diamond crystal 111 is irradiated is generated by an oscillation element 31 (see FIG. 5), which is a microwave source. The oscillation element 31 is, for example, a Voltage Controlled Oscillator (VCO). The oscillation element 31 may include, for example, a semiconductor element such as a Heterojunction Bipolar Transistor (HBT), a Field Effect Transistor (FET), a complementary Metal-Oxide Semiconductor (MOS), or a High Electron Mobility Transistor (HEMT). The material of the semiconductor element is, for example, Si, GaAs, or GaN. Such an oscillation element is connected to the pad 18 by a high-frequency circuit not illustrated. In FIGS. 2 and 3, illustration of the oscillation element is omitted.

Signal Controller

Figure 5:
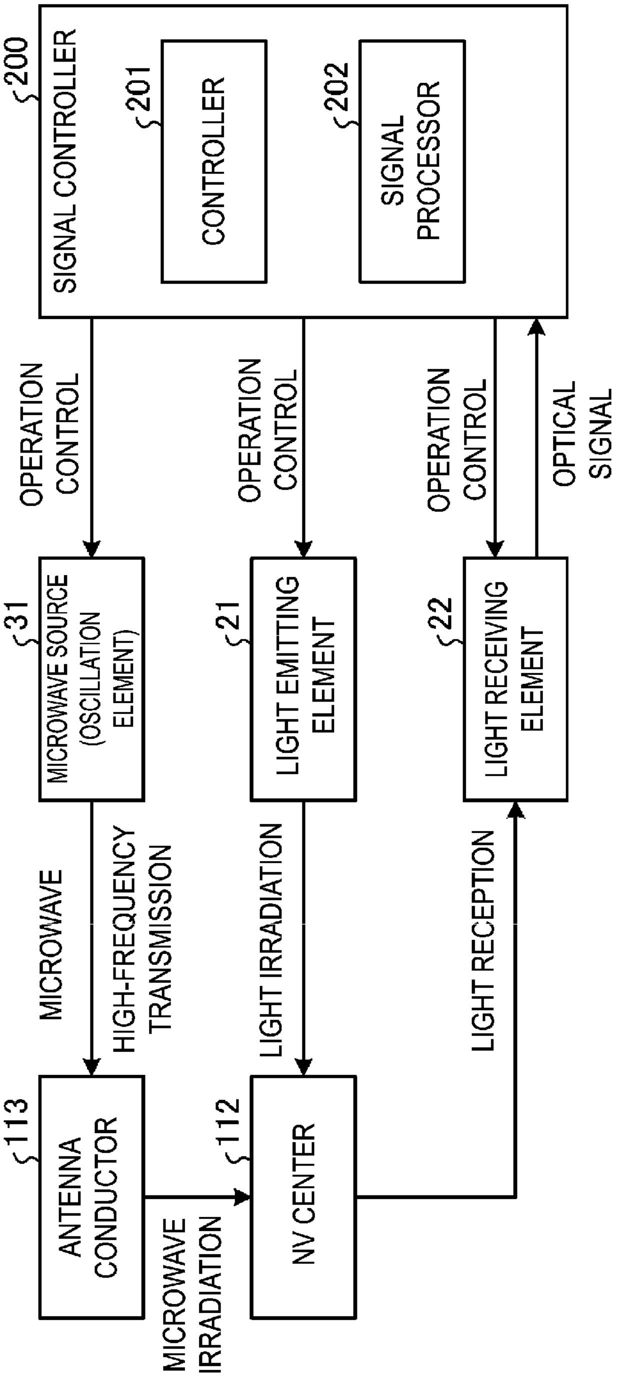
FIG. 5 is a block diagram illustrating an example of a signal controller.

FIG. 5 is a block diagram illustrating an example of a signal controller. A signal controller 200 is, for example, a microcomputer or the like. The signal controller 200 controls a light emitting operation in the light emitting element 21. The signal controller 200 controls a light receiving operation in the light receiving element 22. The signal controller 200 controls an oscillation operation of microwaves in the oscillation element 31, which is a microwave source that generates microwaves. An optical signal of a fluorescent image taken in by the light receiving element 22 is output to the signal controller 200. The signal controller 200 includes a signal processor 202 being a signal processing circuit, and a controller 201 being a control circuit. The controller 201 supplies a timing signal to the light receiving element 22, the light emitting element 21, and the oscillation element 31 to perform operation control. The controller 201 performs control of configuring the frequency of the microwave output from the oscillation element 31. The signal processor 202 performs image processing of the fluorescent image based on the optical signal input from the light receiving element 22. The signal controller 200 and the oscillation element 31 are formed in, for example, a semiconductor chip. FIG. 5 illustrates an example in which the signal controller 200 and the oscillation element 31 are formed as different semiconductor chips, but these may be formed as one semiconductor chip.

Detection Method

A detection method of the magnetic field of a detection target using the detecting device 1 will be described. First, the dielectric body 100, which is the detection target, is placed on the face 110*a* of the sample stage 110. In the dielectric body 100, a magnetic field F1, a magnetic field F2, a magnetic field F3, and a magnetic field F4 are generated by the current I1, the current I2, the current I3, and the current I4.

The face 100*a* of the dielectric body 100 is brought close to or into close contact with the face 111*b* of the diamond crystal 111, which is a magnetic field action surface of the detection substrate 11 of the detecting device 1. A spatial change in the orientation or the magnitude of the magnetic field generated in the dielectric body 100 acts on the NV center 112 in the vicinity of the face 111*b* of the diamond crystal 111 of the detection substrate 11 of detecting device 1.

The light emitting element 21 and the light receiving element 22 of the detecting device 1 then scan the detection substrate 11 with fluorescence and excitation light. Due to this, the NV center 112 is irradiated and excited from the exposed portion 111*c* of the face 111*a* of the diamond crystal 111 of the detection substrate 11. The light emitting element 21 and the light receiving element 22 receive, from the exposed portion 111*c* of the face 111*a* of the diamond crystal 111, an electron spin resonance signal of the NV center 112 excited by the excitation light with the fluorescence. The light emitting element 21 and the light receiving element 22 receive a fluorescence signal corresponding to a change in the orientation or the magnitude of the magnetic field.

In this manner, the light emitting element 21 and the light receiving element 22 of the detecting device 1 detect the magnetic charge of the detection target. The light emitting element 21 and the light receiving element 22 detect the magnitude of the magnetic charge of the detection target. The light emitting element 21 and the light receiving element 22 calculate and output, as a result, the intensity of the magnetic field from signals that are detection results of the light emitting element 21 and the light receiving element 22.

Application of Detecting Device

An application example of the detecting device 1 illustrated in FIG. 2 is a magnetic head of a magnetic force microscope. The magnetic head is used by being connected to the magnetic force microscope. In this case, the semiconductor element in which the signal controller is formed and the semiconductor element in which the microwave source is formed are mounted not on the magnetic head itself but on the magnetic force microscope. The bonding pad 18 is connected to the microwave source, and the light emitting element 21 and the light receiving element 22 are connected to the signal controller.

Effects

As described above, in the present embodiment, the diamond crystal 111 can be provided with both the NV center 112 and the antenna conductor 113. According to the present embodiment, the NV center 112 and the antenna conductor 113 can be provided close to each other. Due to this, in the present embodiment, the antenna conductor 113 can be accurately arranged with respect to the NV center 112. Therefore, in the present embodiment, a microwave having a sufficient intensity can therefore effectively be applied to the NV center 112 at a specific region with a small amount of power.

In the present embodiment, the NV center 112 is arranged in or at the one face 111*b* of the diamond crystal 111, and the antenna conductor 113 is formed on the opposite face 111*a*. In the present embodiment, the antenna conductor 113 on the other face 111*a* can be accurately arranged with respect to the NV center 112 on the one face 111*b* during production. According to the present embodiment, a microwave having a sufficient intensity can effectively be applied to the NV center 112 at a specific region with a small amount of power.

In the present embodiment, the one face 111*b* of the diamond crystal 111 is arranged to be close to the detection target. According to the present embodiment, since the NV center 112 is close to the detection target, measurement accuracy can be improved. In the present embodiment, the NV center 112 is arranged in or at the one face 111*b* of the diamond crystal 111, and the antenna conductor 113 is formed on the opposite face 111*a*, and therefore the one face 111*b* can be brought closer to the detection target.

In the present embodiment, even if a plurality of the antenna conductors 113 are provided and the circuit becomes complicated, the NV centers 112 of the plurality of regions and each circuit can be arranged in a highly accurate positional relationship. According to the present embodiment, expansion of the plurality of NV centers 112 can be easily implemented to operate independently.

In the present embodiment, the NV center 112 and the antenna conductor 113 are integrated with the diamond crystal 111 interposed therebetween. According to the present embodiment, variations in the arrangement can be reduced with respect to assembly as a module, such as temperature fluctuations and mechanical vibration. According to the present embodiment, highly stable operation can be performed.

In the present embodiment, a detection window or the like is not provided on the face 111*b* of the diamond crystal 111, which is a magnetic field action surface of the detection substrate 11 of the detecting device 1. According to the present embodiment, the face 111*b* of the diamond crystal 111 of the detecting device 1 can be brought close to or in close contact with the detection target. Due to this, in the present embodiment, a change in orientation or magnitude of the magnetic field of about several μm, which has been difficult to detect, and a spatial distribution of a current vector detected by a current magnetic field in the order of nT can be detected. In this manner, the present embodiment can improve the detection accuracy of the detection target.

In the present embodiment, the NV center 112 arranged in or at the face 111*b* of the diamond crystal 111 can be brought close to or in close contact with the detection target. According to the present embodiment, a very weak minute current such as leakage can also be detected.

In the present embodiment, the light emitting element 21 and the light receiving element 22 of the detecting device 1 scan the detection substrate 11 with fluorescence and excitation light. According to the present embodiment, a change in orientation or magnitude of a magnetic field generated in the detection target and a spatial distribution of a current vector detected by a current magnetic field can be detected. According to the present embodiment, a complicated current magnetic field path, in other words, a current path or the like can easily be identified.

In the present embodiment, the dielectric base 13 has a tubular shape that accommodates the detection substrate 11. According to the present embodiment, handling can be made easy by unitizing the detector 10.

In the present embodiment, the exposed portion 111*c* is exposed at the face 111*a* of the diamond crystal 111. According to the present embodiment, the light emitting element 21 and the light receiving element 22 can input and output fluorescence and excitation light from the exposed portion 111*c* to and from the face 111*a* of the diamond crystal 111 of the detection substrate 11 of the detector 10.

In the present embodiment, the face 111*b* of the diamond crystal 111 is a smooth face. According to the present embodiment, the face 111*b* of the diamond crystal 111 can be brought into close contact with or close to the face of the detection target at a level equal to or less than several μm in a state of being kept parallel to the face of the detection target. According to the present embodiment, a change in orientation or magnitude of a magnetic field of about several μm, and a spatial distribution of current vectors detected by a current magnetic field in the order of nT can be detected.

In the present embodiment, the optical window 14 accommodated by the dielectric base 13 and arranged to face the detection substrate 11 is included. According to the present embodiment, the detection substrate 11 can be protected from dust and the like.

Second Embodiment

Figure 6:
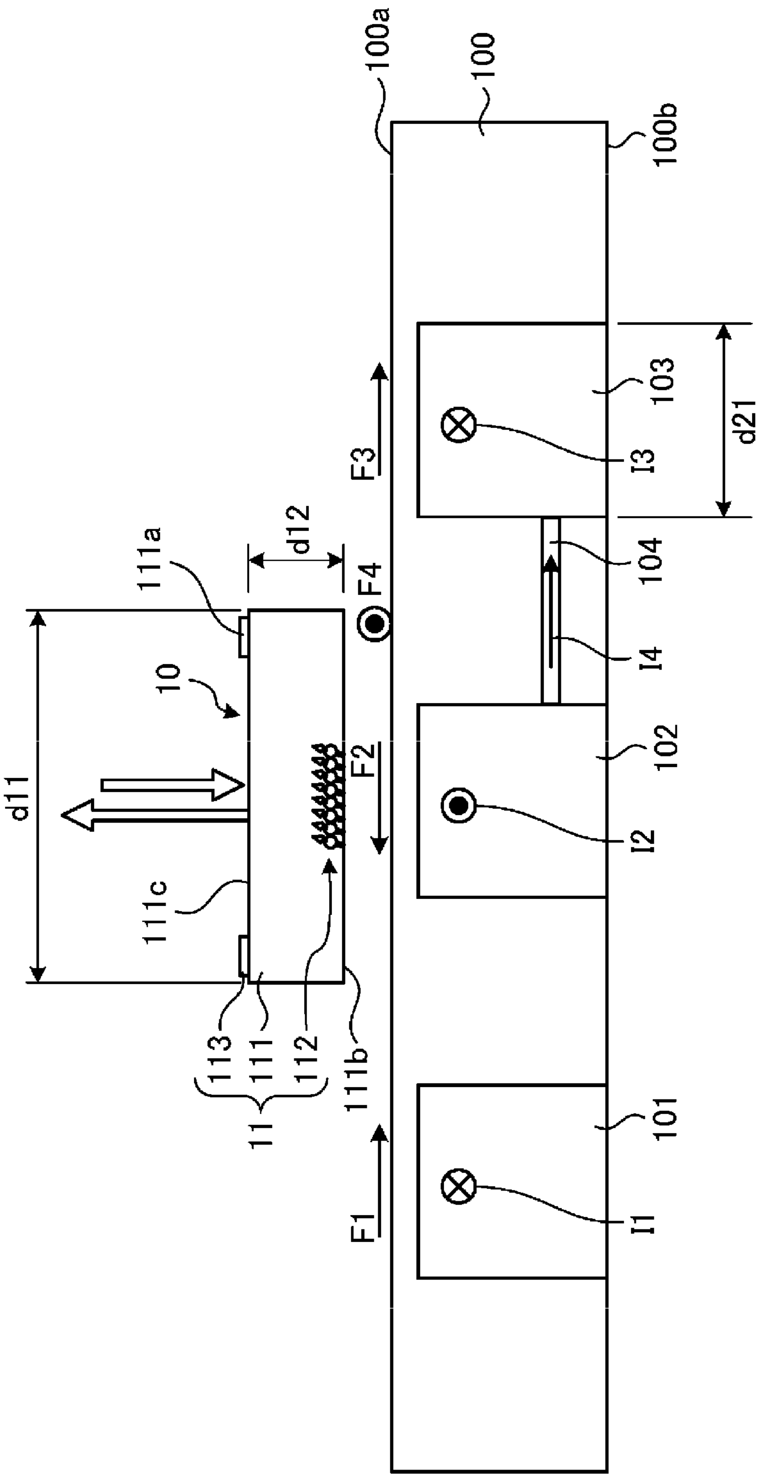
FIG. 6 is a cross-sectional view schematically illustrating a detection substrate of a detector according to a second embodiment.
Figure 7:
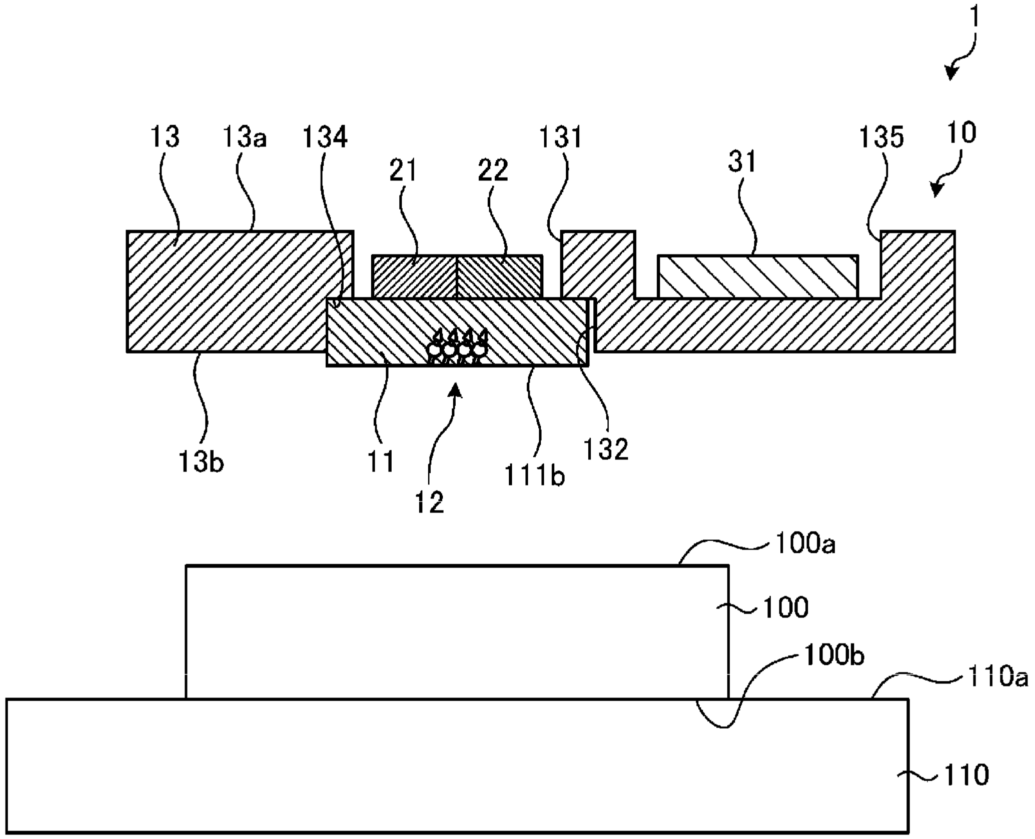
FIG. 7 is a schematic diagram illustrating an example of the detector and a detecting device according to the second embodiment.
Figure 8:
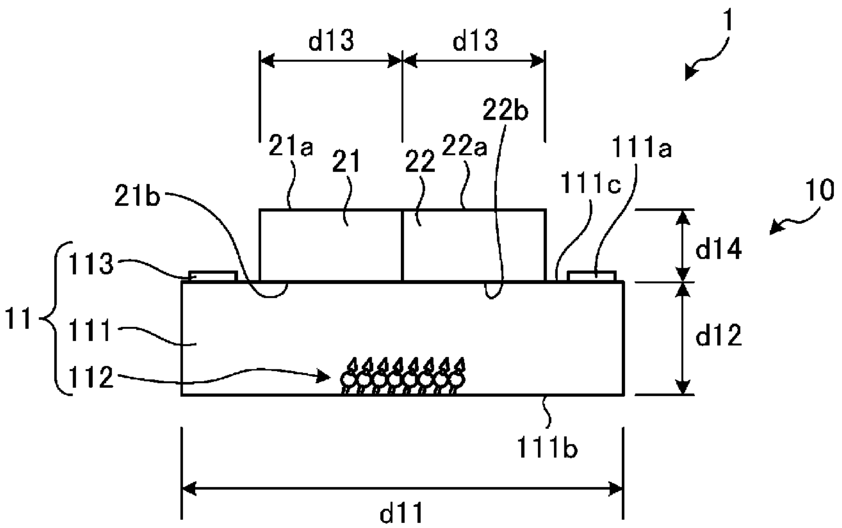
FIG. 8 is a schematic diagram illustrating an example of a detection substrate.

FIG. 6 is a cross-sectional view schematically illustrating the detection substrate of the detector according to a second embodiment. FIG. 7 is a schematic diagram illustrating an example of the detector and the detecting device according to the second embodiment. FIG. 8 is a schematic diagram illustrating an example of the detection substrate. In the second embodiment, the same reference signs are given to the same configurations as those of the first embodiment, and the description thereof will be omitted.

In the diamond crystal 111, the length d11 of one side is, for example, 1 mm. The diamond crystal 111 has the thickness d12 of, for example, 200 μm.

The face 111*a* is abuts a contact 134 of the dielectric base 13 described later.

Figure 9:
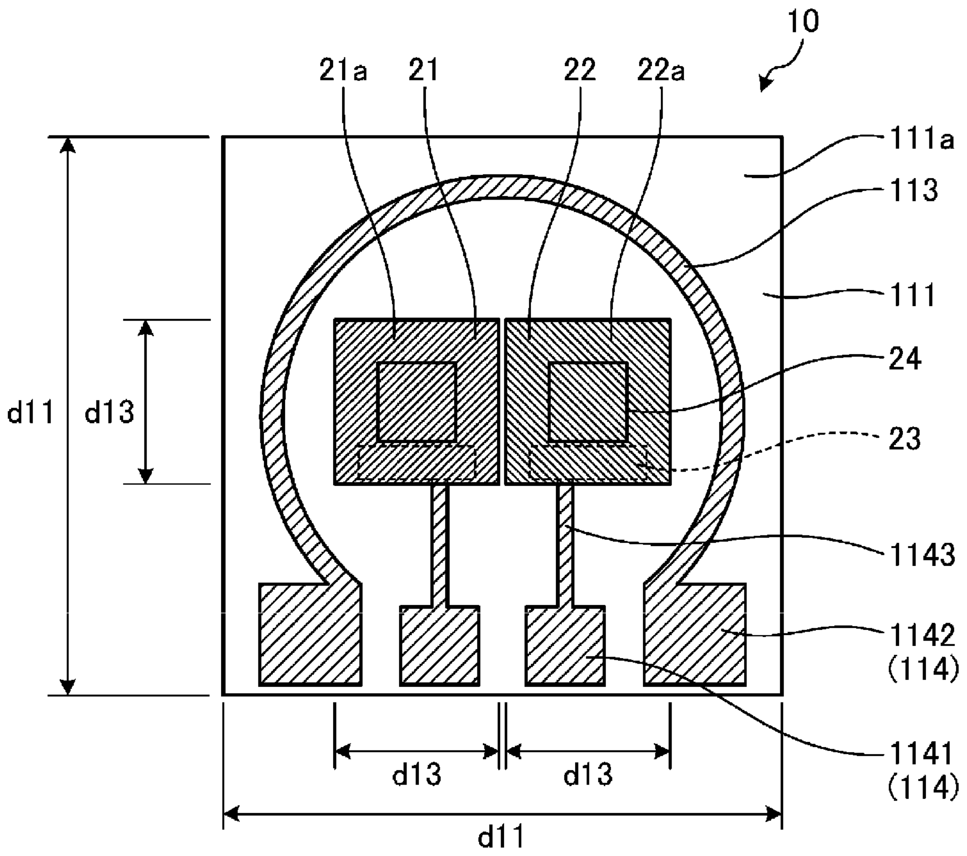
FIG. 9 is a plan view illustrating an example of an antenna conductor.

FIG. 9 is a plan view illustrating an example of the antenna conductor. The antenna conductor 113 transmits microwaves with which the NV center 112 of the diamond crystal 111 is irradiated. The antenna conductor 113 is positioned on the face 111*a* of the diamond crystal 111 opposite to the face 111*b* in or at which the NV center 112 is arranged. The antenna conductor 113 is interposed between the solder 15 and the face 111*a* of the diamond crystal 111. The antenna conductor 113 is provided at an outer peripheral side on the face 111*a* of the diamond crystal 111. The antenna conductor 113 has a ring shape as viewed in the normal direction (hereinafter, referred to as "plan view") of the face 111*a*. The antenna conductor 113 is a loop antenna made of a conductor thin film. The antenna conductor 113 has a partially open ring shape. An end portion of the antenna conductor 113 is connected to the pad conductor 1142 of a high-frequency line conductor 114. The antenna conductor 113 has a loop diameter of about several mm.

The antenna conductor 113 is a micro loop antenna. The frequency of the antenna conductor 113 is, for example, from 2.8 GHz to 2.9 GHz. The antenna conductor 113 has, for example, an input power of −20 dBm.

Figure 10:
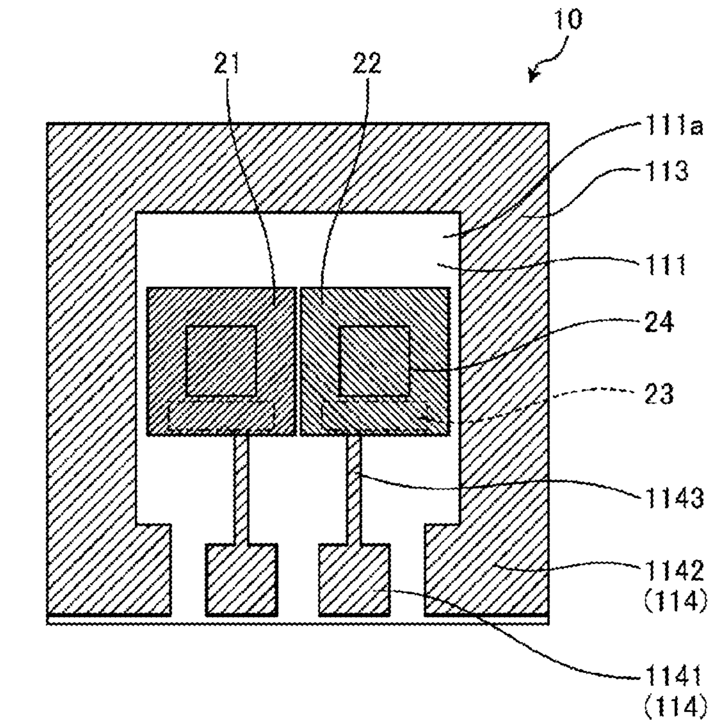
FIG. 10 is a plan view illustrating another example of the antenna conductor.
Figure 11:
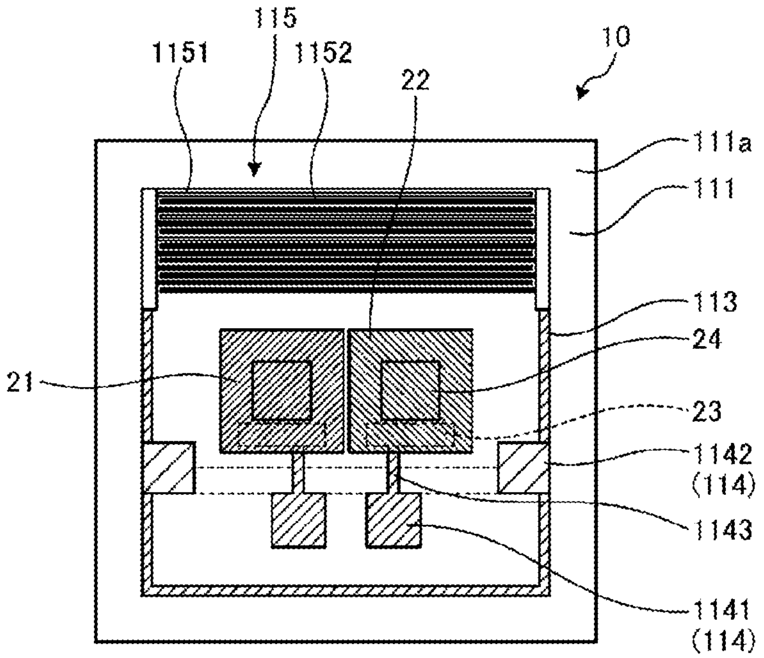
FIG. 11 is a plan view illustrating another example of the antenna conductor.

The high-frequency line conductor 114 is formed on the face 111*a* of the diamond crystal 111. The high-frequency line conductor 114 includes a central conductor and a ground conductor separated from the central conductor by a certain distance. The impedance is adjusted through the distance between the central conductor and the ground conductor. The central conductor and the ground conductor are respectively connected to the central conductor and the ground conductor of the high-frequency line conductor not illustrated of the dielectric base 13 by solder. As illustrated in FIGS. 9 to 11, the antenna conductor 113 may be directly connected to a pad conductor 1141 and the pad conductor 1142 without providing the high-frequency line conductor 114 with a ground conductor. A line connecting between the pad conductor 1141 and the pad conductor 1142 may constitute the high-frequency line conductor 114 and may be as short as possible.

A front electrode 23 is connected to the pad conductor 1141 via wiring 1143. The pad conductor 1141 is made of, for example, gold. The pad conductor 1141 has a film thickness, for example, from 200 nm and to 1000 nm.

The end portion of the antenna conductor 113 is connected to the pad conductor 1142. The pad conductor 1142 is made of, for example, gold. The pad conductor 1142 has a film thickness, for example, from 200 nm to 1000 nm.

The oscillation element 31 is electrically connected to wiring on the dielectric base 13. The oscillation element 31 is in contact with the dielectric base 13. The oscillation element 31 is positioned on the face 111*a* of the diamond crystal 111 opposite to the face 11*b* where the NV center 112 is formed. The oscillation element 31 is accommodated in a third accommodation 135 of the dielectric base 13. The oscillation element 31 may be connected to the ground conductor of the dielectric base 13 by a wire bond connection or a solder ball connection. The oscillation element 31 is electrically connected to the antenna conductor 113 of the detection substrate 11 at the contact 134 of the dielectric base 13.

In the dielectric base 13, the high-frequency line conductor not illustrated of the dielectric base 13, the high-frequency line conductor 114 arranged on the face 111*a* of the diamond crystal 111, and the antenna conductor 113 are electrically connected to the detection substrate 11 via solder.

The dielectric base 13 includes the first accommodation 131, the second accommodation 132, and the third accommodation 135. The first accommodation 131 and the second accommodation 132 are continuous in the axial direction. The first accommodation 131 and the second accommodation 132 penetrate from the face 13*a* to the face 13*b* of the dielectric base 13. The opening width of the first accommodation 131 is wider than the opening width of the second accommodation 132. A boundary between the first accommodation 131 and the second accommodation 132 includes the contact 134 having a narrow opening width.

The first accommodation 131 is arranged at one side in the axial direction of the dielectric base 13. The light emitting element 21 and the light receiving element 22 are arranged at the first accommodation 131. The second accommodation 132 is a supporter supporting the detection substrate 11. The second accommodation 132 is arranged at the other side in the axial direction of the dielectric base 13. The detection substrate 11 is arranged at a center portion of the second accommodation 132 of the dielectric base 13.

The third accommodation 135 is formed in a recess shape on the face 13*a* of the dielectric base 13. The oscillation element 31 is arranged at the third accommodation 135.

The first accommodation 131, the second accommodation 132, and the third accommodation 135 may be provided with a lid to hermetically seal the inside thereof. The dielectric base 13 may be provided with a lead terminal or a ball terminal.

FIG. 7 illustrates a configuration in which the face 111*b* protrudes more than the face 13*b* of the dielectric base 13 in the axial direction, but the face 111*b* and the face 13*b* of the dielectric base 13 may be flush.

The solder is provided on the contact 134 of the dielectric base 13. The solder is provided having a ring shape in a plan view. The solder is electrically connected to the high-frequency line conductor 114 of the detection substrate 11, the antenna conductor 113, and the interior pattern of the dielectric base 13.

Detecting Device

The light emitting element 21 and the light receiving element 22 are arranged inside the ring shape of the antenna conductor 113. A light emission portion and a light incident portion are arranged facing the face 111*a*. For example, as illustrated in FIG. 7, the light emitting element 21 and the light receiving element 22 are arranged in close contact with the exposed portion 111*c* of the face 111*a* of the diamond crystal 111. In this case, power is fed to each of the light emitting element 21 and the light receiving element 22 from the pad conductor 1141 and the wiring 1143 formed independently from the dielectric base 13. The light emitting element 21 and the light receiving element 22 may be connected to the ground conductor of the dielectric base 13 by a wire bond connection or a solder ball connection.

For example, the light emitting element 21 and the light receiving element 22 may be arranged immediately above the exposed portion 111*c* of the face 111*a* of the diamond crystal 111 while being separated from each other by a certain distance. In this case, for example, an optical component such as a lens, a filter, an isolator, a mirror, or an antireflection film may be used between the light emitting element 21 and the light receiving element 22, and the NV center 112.

In the light emitting element 21 and the light receiving element 22, a length d13 of one side is, for example, 300 μm. The light emitting element 21 and the light receiving element 22 have a thickness d14 of, for example, 100 μm.

The front electrode 23 is arranged on a face 21*b* being a lower face of the light emitting element 21, and a face 22*b* being a lower face of the light receiving element 22. The front electrode 23 is connected to the ground conductor of the dielectric base 13 by a wire bond connection.

A back electrode 24 is arranged on a face 21*a* being an upper face of the light emitting element 21, and a face 22*a* being an upper face of the light receiving element 22. The back electrode 24 is connected to the ground conductor of the dielectric base 13 by wire bond connection.

The upper face of the light emitting element 21 and the upper face of the light receiving element 22 are faces of the light emitting element 21 and the light receiving element 22 opposite to the diamond crystal 111. The lower face of the light emitting element 21 and the lower face of the light receiving element 22 are faces of the light emitting element 21 and the light receiving element 22 at the diamond crystal 111 side. The light input/output side faces of the light emitting element 21 and the light receiving element 22 face the NV center 112.

When the light emitting element 21 is, for example, a diode such as an LED or an LD, the front electrode 23 and the back electrode 24 function as an anode electrode or a cathode electrode, respectively. Either the front electrode 23 or the back electrode 24 may be an anode electrode or a cathode electrode. When the light receiving element 22 is, for example, a diode such as a PD, the front electrode 23 and the back electrode 24 function as an anode electrode or a cathode electrode, respectively. Either the front electrode 23 or the back electrode 24 may be an anode electrode or a cathode electrode. The front electrode 23 of the light emitting element 21 is connected to the pad conductor 1141 via the wiring 1143. The front electrode 23 of the light receiving element 22 is connected to the pad conductor 1141 via the wiring 1143. The pad conductor 1141 and the back electrode 24 are electrically connected to the semiconductor element in which the signal controller 200 (see FIG. 5) is formed.

Detection Method

The face 100*a* of the dielectric body 100 is brought close to or into close contact with the face 111*b* of the diamond crystal 111, which is a magnetic field action surface of the detection substrate 11 of the detecting device 1. As illustrated in FIG. 5, the microwave generated by the oscillation element 31, which is a microwave source, propagates to the antenna conductor 113 of the detection substrate 11 through the high-frequency transmission line not illustrated provided inside the dielectric base 13. Microwaves are then emitted from the antenna conductor 113. The emitted microwaves act on the NV center 112 to cause electron spin resonance. A spatial change in the orientation or the magnitude of the magnetic field generated in the dielectric body 100 acts on the NV center 112 in the vicinity of the face 111*b* of the diamond crystal 111 of the detection substrate 11 of detecting device 1.

The light emitting element 21 and the light receiving element 22 of the detecting device 1 then scan the detection substrate 11 with fluorescence and excitation light. More specifically, green excitation light of the light emitting element 21 is incident from the exposed portion 111*c* side of the face 111*a*, which is the back face of the diamond crystal 111, to the face 111*b* side, which is the front face. Then, the green excitation light incident on the face 111*b* side is diffused by being spread out inside the face 111*b* of the diamond crystal 111, and irradiates and excites the NV center 112. Due to this, the NV center 112 is irradiated and excited from the exposed portion 111*c* of the face 111*a* of the diamond crystal 111 of the detection substrate 11.

The NV center 112 having been excited generates red fluorescence, and is incident from the face 111*b* side, which is the front face of the diamond crystal 111, to the exposed portion 111*c* side of the face 111*a*, which is the back face. Then, the red excitation light is diffused by being spread out inside the face 111*a* of the diamond crystal 111, and is incident on the light receiving face of the light receiving element 22. The light emitting element 21 and the light receiving element 22 receive, from the exposed portion 111*c* of the face 111*a* of the diamond crystal 111, the electron spin resonance signal of the NV center 112 excited by the excitation light with the fluorescence. The light emitting element 21 and the light receiving element 22 receive a fluorescence signal corresponding to a change in the orientation or the magnitude of the magnetic field.

The magnetic field of the measurement target acts on the NV center 112 to change the electron spin resonance frequency. The red fluorescence intensity changes with the change in the electron spin resonance frequency. Then, by reading this, the detecting device 1 detects the magnitude of the magnetic field. The detecting device 1 operates as a current sensor by measuring the magnetic field by the current.

Application of Detecting Device

An example of an application of the detecting device 1 illustrated in FIG. 7 is a measurement device for a charge/discharge current of a battery. In this case, the semiconductor element in which the signal controller is formed and the semiconductor element in which the microwave source is formed are configured as a module integrated with the diamond crystal 111. In FIG. 7, only the semiconductor element in which the microwave source is formed is illustrated as the oscillation element 31, but a semiconductor element in which a signal controller is separately formed may be provided.

Effects

As described above, in the present embodiment, the detecting device 1 is formed by integrating the detector 10, the light emitting element 21, and the light receiving element 22. In the present embodiment, the oscillation element 31 is electrically connected to the wiring on the dielectric base 13. With the present embodiment, a magnetic sensor using a diamond crystal can be made compact, simple, and robust. According to the present embodiment, since the diamond crystal has no hysteresis and has excellent linearity in magnetic field measurement, current integration can be detected with high accuracy. In the present embodiment, for example, when a secondary battery is repeatedly charged and discharged, errors are not integrated, and the charge amount of the storage battery can be accurately known and predicted. The present embodiment can be suitably used for, for example, a storage battery system and an inverter system of an electric vehicle.

In the present embodiment, the oscillation element 31 is in contact with the dielectric base 13. According to the present embodiment, the magnetic sensor using the diamond crystal can be downsized.

In the present embodiment, the oscillation element 31 is positioned on the face 111*a* of the diamond crystal 11 opposite to the face 11*b* in or at which the NV center 112 is arranged, and is not positioned on the face 111*b* side of the diamond crystal 111, which is the magnetic field action surface of the detection substrate 111 of the detecting device 1. According to the present embodiment, the face 111*b* of the diamond crystal 111 of the detecting device 1 can be brought close to or in close contact with the detection target.

In the present embodiment, the face 111*b* of the diamond crystal 111, which is the magnetic field action surface of the detection substrate 11 of the detecting device 1, protrudes more than the face 13*b* of the dielectric base 13. According to the present embodiment, the face 111*b* of the diamond crystal 111 of the detecting device 1 can be brought close to or in close contact with the detection target. Due to this, in the present embodiment, a change can be detected in orientation or magnitude of the magnetic field of about several μm, which has been difficult to detect, and a current vector can be detected by a current magnetic field in the order of nT. In this manner, the present embodiment can improve the detection accuracy of the detection target.

First Variation

FIG. 10 is a plan view illustrating another example of the antenna conductor. The antenna conductor 113 illustrated in FIG. 10 has a rectangular frame shape with one side opened. The light emitting element 21 and the light receiving element 22 are arranged inside the antenna conductor 113.

Second Variation

Figure 12:
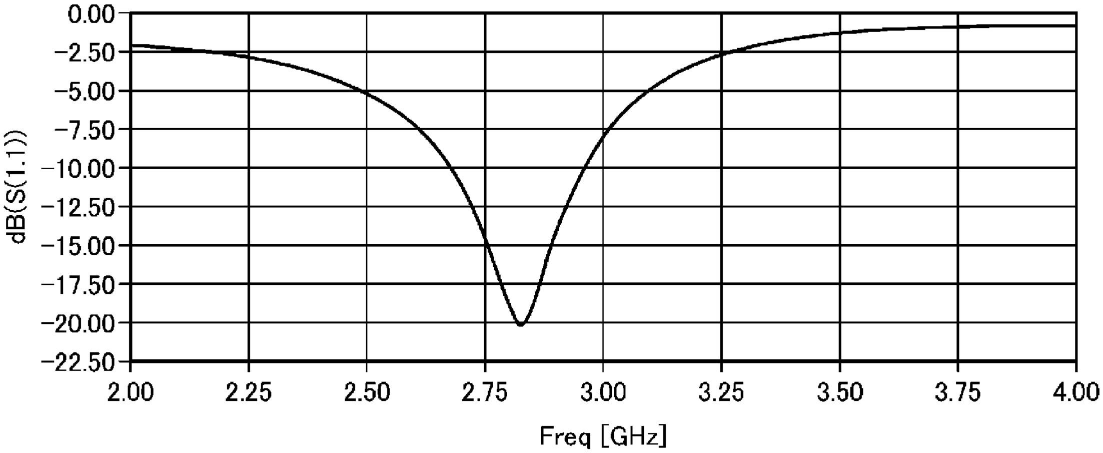
FIG. 12 is a graph showing an example of a reflection characteristic of the antenna conductor.

FIG. 11 is a plan view illustrating another example of the antenna conductor. The antenna conductor 113 illustrated in FIG. 11 has a rectangular frame shape. A part of the antenna conductor 113 is provided with a comb 115. In the comb 115, a comb 1151 including comb teeth directed from one side of the rectangle of the antenna conductor 113 to the opposite side and a comb 1152 including comb teeth directed from the opposite side to the one side engage each other. The comb 115 is what is called an Inter Digital Transducer (IDT) and constitutes a capacitance forming portion. The combs 1151 and 1152 constitute a capacitance. The combs 1151 and 1152 can suppress reflection of microwaves having a specific frequency incident on the antenna conductor 113 by adjusting the line & space and logarithm of an armature. By providing the comb 115, microwaves can be effectively emitted of about 3 GHz even when the antenna conductor 113 has a minute size, and is therefore suitable for detection of a microcircuit. As described above, the antenna conductor 113, which is a radiator, includes a first side including the first comb 1151 and a second side including the second comb 1152. The first comb 1151 and the second comb 1152 engage each other and form a capacitance forming portion. FIG. 12 is a graph showing an example of a reflection characteristic of the antenna conductor 113. FIG. 12 shows an example of the $S_{11}$ reflection characteristic as viewed from the pad conductor 1142. The $S_{11}$ reflection characteristic shown in FIG. 12 indicates that the reflection of the microwave of 2.7 to 2.9 GHz from the antenna conductor 113 is suppressed, and the microwave of 2.7 to 2.9 GHz is effectively emitted from the antenna conductor 113.

In the above description, a member or fluid having high relative magnetic permeability may be inserted between the detection substrate 11 of the detecting device 1 and the detection target. This can further improve the detection accuracy.

In the above description, a member or a fluid having a high relative magnetic permeability may be inserted into a space positioned on an optical path of fluorescence and excitation light inside the detector 10. This can further improve the detection accuracy.

Other Variations

In the above description, a member or fluid having high relative magnetic permeability may be inserted between the detection substrate 11 of the detecting device 1 and the detection target. This can further improve the detection accuracy.

In the above description, a member or a fluid having a high relative magnetic permeability may be inserted into a space positioned on an optical path of fluorescence and excitation light inside the detector 10. This can further improve the detection accuracy.

Instead of the dielectric base 13, a high-frequency micro signal may be input to the antenna conductor 113 by a fiber or the like.

An insulating film may be formed on the antenna conductor 113, and another antenna conductor 113 may be further laminated thereon. In this case, the operation can be performed at a plurality of frequencies. With this, the electron spin resonance points can easily be measured at a plurality of points.

In the above description, it has been described that the NV center 112 is arranged in or at the one face 111*b* of the diamond crystal 111, and the antenna conductor 113 is formed on the opposite face 111*a*, but the present application is not limited thereto. The NV center 112 and the antenna conductor 113 may be arranged on the face 111*a*, or the NV center 112 and the antenna conductor 113 may be arranged on the face 111*b*.

The antenna conductor 113 may be configured as follows. The antenna conductor 113 is arranged on one face of a separate substrate separate from the diamond crystal 111. One face of the separate substrate is arranged in close contact with a face of the diamond crystal 111. The radiator provided on the diamond crystal 111 includes the antenna conductor 113 arranged as described above. The separate substrate is preferably a glass plate transparent to excitation light and fluorescence, for example. A separate substrate made of a glass plate is arranged on the face 111*a* of the diamond crystal 111. When the light receiving element 21 and the light emitting element 22 are further arranged thereon, light can be input and output through the separate substrate. The separate substrate may be made of a non-light transmitting substrate that is not a glass plate, for example. In this case, a separate substrate that is a non-light transmitting substrate is arranged on the face 111*a* of the diamond crystal. Light may be input to and output from the light receiving element 21 and the light emitting element 22 from the lower side of the diamond crystal 111.

The embodiments disclosed in the present application can be modified without departing from the spirit and scope of the invention. The embodiments and variations thereof disclosed in the present application can be combined as appropriate.

Embodiments have been described in order to fully and clearly disclose the technology according to the appended claims. However, the appended claims are not to be limited to the embodiments described above and may be configured to embody all variations and alternative configurations that those skilled in the art may make within the underlying matter set forth herein.

REFERENCE SIGNS

1 Detecting device
10 Detector
11 Detection substrate
111 Diamond crystal
111*a*, 111*b* Face
112 NV center
113 Antenna conductor (radiator)
13 Dielectric base
13*a*, 13*b* Face
131 First accommodation
132 Second accommodation
133 Flange
14 Optical window
14*a*, 14*b* Face
15 Solder
16 Interior pattern
17 RF via
18 Bonding pad
21 Light emitting element
22 Light receiving element
31 Oscillation element (microwave source)
100 Dielectric
101, 102, 103, 104 Conductor
200 Signal controller
201 Controller
202 Signal processor
F1, F2, F3, F4 Magnetic field
I1, I2, I3, I4 Current

The invention claimed is:

1. A detection substrate comprising:
a diamond crystal in which an NV center is formed; and
an antenna conductor provided directly on the diamond crystal, the antenna conductor comprising a first side including a first comb and a second side including a second comb, the first comb and the second comb engaging each other and forming a capacitance forming portion, the first comb, and the second comb configured to emit microwaves acting on the NV center.

2. The detection substrate according to claim 1, wherein the NV center is arranged in or at one face of the diamond crystal, and the antenna conductor, the first comb, and the second comb are arranged at a face of the diamond crystal opposite to the one face at which the NV center is formed.

3. The detection substrate according to claim 2, wherein the one face of the diamond crystal is arranged close to a detection target.

4. A detector comprising:
the detection substrate according to claim 1; and
a dielectric base.

5. The detector according to claim 4, wherein the NV center is arranged in or at one face of the diamond crystal, and the antenna conductor is arranged at a face of the diamond crystal opposite to a face at which the NV center is formed.

6. The detector according to claim 5, wherein the one face of the diamond crystal is arranged close to a detection target.

7. The detector according to claim 4, wherein the dielectric base is electrically connected to the detection substrate via the antenna conductor.

8. The detector according to claim 7, wherein the dielectric base comprises an oscillation element electrically connected to wiring on the dielectric base, and the antenna conductor is electrically connected to the oscillation element via the wiring.

9. The detector according to claim 8, wherein the oscillation element is in contact with the dielectric base.

10. The detector according to claim 9, wherein the oscillation element is positioned at the face opposite to the one face at which the NV center is formed.

11. The detector according to claim 4, wherein the dielectric base has a tubular shape that accommodates the detection substrate.

12. The detector according to claim 4, wherein the antenna conductor has a ring shape, and a portion where the antenna conductor is not arranged is exposed at the face of the diamond crystal opposite to the one face at which the NV center is formed.

13. The detector according to claim 4, wherein the one face of the diamond crystal at which the NV center is formed is a smooth face.

14. A detecting device comprising:
the detector according to claim 4,
a light emitting element, and
a light receiving element,
wherein the light emitting element is configured to irradiate the NV center with light, and the light receiving element is configured to receive fluorescence of the NV center.

15. The detecting device according to claim 14, wherein the NV center is arranged in or at one face of the diamond crystal;
the antenna conductor is arranged at a face of the diamond crystal opposite to a face at which the NV center is formed; and
the light emitting element and the light receiving element are arranged in close contact with a portion where the radiator is not arranged, at the face of the diamond crystal opposite to the one face at which the NV center is formed.

16. The detecting device according to claim 15, wherein the light emitting element and the light receiving element are arranged, at the face of the diamond crystal opposite to the one face at which the NV center is formed, immediately above the portion where the antenna conductor is not arranged, while being separated by a certain distance.

17. The detecting device according to claim 16, wherein the detector comprises an optical window accommodated by the dielectric base, the optical window facing the detection substrate.

* * * * *